United States Patent [19]

Ozaki et al.

[11] Patent Number: 4,808,844
[45] Date of Patent: Feb. 28, 1989

[54] SEMICONDUCTOR DEVICE

[75] Inventors: Hideyuki Ozaki; Kazutoshi Hirayama; Kazuyasu Fujishima; Hideto Hidaka, all of Hyogo, Japan

[73] Assignee: Mitsubishi Denki Kabushiki Kaisha, Tokyo, Japan

[21] Appl. No.: 32,624

[22] Filed: Apr. 1, 1987

[30] Foreign Application Priority Data

Apr. 17, 1986 [JP] Japan ................................. 61-88716

[51] Int. Cl.$^4$ .................... H04Q 9/00; H03K 17/693; H03K 17/16; H03K 5/01
[52] U.S. Cl. ................................. 307/243; 307/303.2; 307/482.1; 307/465.1; 307/585
[58] Field of Search ............ 307/303, 279, 243, 303.2, 307/482.1, 465.1, 465, 468, 585, 451, 452; 357/45; 361/403, 410, 416; 365/190, 220, 221, 104; 340/825.91

[56] References Cited

U.S. PATENT DOCUMENTS

| | | | |
|---|---|---|---|
| 4,384,345 | 5/1983 | Mikome | 357/45 |
| 4,386,284 | 5/1983 | Wacyk et al. | 307/571 |
| 4,491,839 | 1/1985 | Adam | 307/243 |
| 4,523,106 | 6/1985 | Tanizawa et al. | 307/279 |
| 4,638,181 | 1/1987 | Deiss | 307/243 |
| 4,697,095 | 9/1987 | Fujii | 307/243 |
| 4,733,105 | 3/1988 | Shin et al. | 307/243 X |

FOREIGN PATENT DOCUMENTS

3218992A1 11/1983 Fed. Rep. of Germany ...... 307/243

OTHER PUBLICATIONS

IEEE International Solid-State Circuits Conference, Digest of Technical Papers, "A 1 Mb DRAM with Filded Capicator Cell Structure" by F. Horiguchi et al, pp. 244–245 and p. 355, 1985.
IEEE International Solid-State Circuits Conference, Digest of Technical Papers, "A 50 A Stand by 1 MW×1b/256 KW×4b CMOS DRAM" by S. Fujii et al, pp. 266–267, 1986.

Primary Examiner—Stanley D. Miller
Assistant Examiner—David R. Bertelson
Attorney, Agent, or Firm—Lowe, Price, Leblanc, Becker & Shur

[57] ABSTRACT

A semiconductor device formed on a semiconductor chip (1) comprises a plurality of first bonding pads (3a, 3d) for receiving an identical external signal, an internal circuit (8) connected to any one of the plurality of the first bonding pads, a second bonding pad (11) for receiving a control signal from outside the semiconductor chip, and a bonding pad selection switch (19) for selecting a bonding pad out of the plurality of first bonding pads and connecting it to the internal circuit in response to the control signal supplied thereto through the second bonding pad.

13 Claims, 2 Drawing Sheets

SEMICONDUCTOR DEVICE

BACKGROUND OF THE INVENTION

1. Field of the Invention

The present invention relates to a semiconductor device and particularly to a semiconductor device in which a plurality of bonding pads for receiving an identical external signal are provided on a semiconductor chip.

2. Description of the Prior Art

As a package for assembling therein a semiconductor device formed on a semiconductor chip, there are known various types such as a ceramic package, a plastic package, a dual in-line package (DIP), a small outline package (SOP) and a zigzag in-line package (ZIP). In a conventional semiconductor device, a plurality of bonding pads for receiving an identical external signal are provided on a semiconductor chip so that the semiconductor chip on which the semiconductor device is formed can be assembled in any suitable one of such different packages according to the application for which it is used. Thus, even if an arrangement of pins for externals signal is changed dependent on the package, the semiconductor chip can be assembled in a different package without changing the layout of the semiconductor device.

FIG. 1 is a schematic plan view showing a structure of a conventional semiconductor device comprising two bonding pads for receiving an identical external signal, one for a ceramic package and the other for a plastic package. Referring to FIG. 1, a device in which an integrated circuit for a dynamic random access memory (RAM) or the like is incorporated is formed on a semiconductor chip 1. A first bonding pad 3a for receiving a signal A0, a bonding pad 3b for a signal A2, and a bonding pad 3c for a signal A1 are provided spaced from one another on a peripheral surface of a shorter side of the semiconductor chip 1. A second bonding pad 3d for the signal A0 is provided on a peripheral surface of a longer side of the semiconductor chip 1. An internal buffer circuit 8 for waveform-shaping or the like of the received signals is provided on the peripheral surface of the shorter side of the semiconductor chip 1. The first bonding pad 3a for the signal A0 and the second bonding pad 3d for the signal A0 are connected with each other by a wire 7. The wire 7 is connected to the internal buffer circuit 8 by a wire 7'. Thus, the first bonding pad 3a for the signal A0 and the second bonding pad 3d for the signal A0 are both connected to the internal buffer circuit 8.

FIG. 2 is a partial plan view schematically showing a structure in which the semiconductor device shown in FIG. 1 is assembled in a ceramic package. In FIG. 2, the semiconductor chip 1 is assembled in the ceramic package 2. A terminal 4a for the signal A0, a terminal 4b for the signal A2, a terminal 4c for the signal A1 etc. corresponding to the first bonding pad 3a for the signal A0, the bonding pad 3b for the signal A2, the bonding pad 3c for the signal A1 etc. on the semiconductor chip 1 are provided with spacings on a peripheral surface of the ceramic package 2. The first bonding pad 3a for the signal A0 and the terminal 4a for the signal A0 are bonded through a bonding wire 6a. The bonding pad 3b for the signal A2 and the terminal 4b for the signal A2 are bonded through a bonding wire 6b. The bonding pad 3c for the signal A1 and the terminal 4c for the signal A1 are bonded through a bonding wire 6c. In the above described structure, the first bonding pad 3a is used as a bonding pad for the signal A0, while the second bonding pad 3d for the signal A0 is not bonded. The terminal 4a for the signal A0, the terminal 4b for the signal A2, and the terminal 4c for the signal A1 are connected to a fifth pin, a sixth pin, and a seventh pin (not shown), respectively, for input of external signals, which are exposed on an external surface of the ceramic package 2. The reference numerals ⑤, ⑥, and ⑦ in the figure represent the pin numbers in the ceramic package 2. The fifth pin, the sixth pin, and the seventh pin receive the external signals A0, A2, and A1, respectively.

FIG. 3 is a partial plan view schematically showing a structure in which the semiconductor device shown in FIG. 1 is assembled in a plastic mold package. In FIG. 3, the semiconductor chip 1 is assembled in the plastic mold package 20. A terminal 5a for the signal A0, a terminal 5b for the signal A2, a terminal 5c for the signal A1 etc. are provided spaced from one another on the plastic mold package 20 in a manner in which the terminals 5a, 5b, 5c etc. surround the semiconductor chip 1. The second bonding pad 3d for the signal A0 and the terminal 5a for the signal A0 are bonded by a bonding wire 6a. The bonding pad 3b for the signal A2 and the terminal 5b for the signal A2 are bonded by a bonding wire 6b. The bonding pad 3c for the signal A1 and the terminal 5c for the signal A1 are bonded by a bonding wire 6c. In this structure, the second bonding pad 3d is used as a bonding pad for the signal A0, while the first bonding pad 3a for the signal A0 is not bonded. The terminal 5a for the signal A0, the terminal 5b for the signal A2 and the terminal 5c for the signal A1 are connected to the fifth pin, the sixth pin and the seventh pin (not shown), respectively, for receiving external signals, which are exposed on an external surface of the plastic mold package 20. The reference numerals ⑤, ⑥ and ⑦ in FIG. 3 represent the pin numbers in the plastic mold package 20. The fifth pin, the sixth pin and the seventh pin receive the external signals A0, A2 and A1, respectively.

As described above, either of the two bonding pads for the same external signal formed on the same semiconductor chip is used according to the type of a package in which the semiconductor device is assembled. Thus, bonding between the bonding pads of the semiconductor chip and the terminals of the package is simplified.

However, in the conventional semiconductor device, two bonding pads are always connected for the same external signal A0. In this case, there is involved a problem that and input capacitance viewed from the corresponding pin for receiving the external signal is increased to exceed a permissible value, causing erroneous operation.

Prior art documents related to the present invention are, for example, "A 1Mb DRAM with a Folded Capacitor Cell Structure" by F. Horiguchi et al., 1985 IEEE International Solid-State Circuits Conference, Digest of Technical Papers, pp. 244–245 and p. 355, and "A 50 µA Stand by 1MW ×1b/256KW×4b CMOS DRAM" by S. Fujii et al., 1986 IEEE International Solid-State Circuits Conference, Digest of Technical Papers, pp. 266–267.

The first document discloses a structure in which switching between fast-access functions of a dynamic RAM, namely, a page mode and a nibble mode is effected by using a bonding pad method.

The second document discloses a technique in which switching between 1 MW×1 bit configuration and 256KW×4 bit configuration is effected by using a bonding pad method.

SUMMARY OF THE INVENTION

The above described disadvantages of a conventional semiconductor device have been overcome by the present invention and it is an object of the present invention to provide a semiconductor device in which, if a plurality of bonding pads for an identical signal are provided on a semiconductor chip, an input capacitance viewed from a corresponding pin for receiving the signal can be made almost equal to an input capacitance in case of only a single bonding pad being provided on a semiconductor chip.

A semiconductor device in accordance with the present invention comprises, on a semiconductor chip, a plurality of first bonding pads for transmitting and receiving a signal to and from an external equipment, an internal circuit for transmitting and receiving the above stated signal to and from the external equipment through one of the first bonding pads, a second bonding pad for receiving a control signal supplied from an external equipment, and selection means provided between the plurality of first bonding pads and the internal circuit for connecting one of the plurality of first bonding pads to the internal circuit in response to the above stated control signal supplied thereto through the second bonding pad.

In the above described structure, the selection means selects one of the plurality of the first bonding pads dependent on whether or not the control signal is supplied to the second bonding pad, thereby to connect the selected one to the internal circuit, and disconnects the other first bonding pads from the internal circuit. As a result, an input capacitance viewed from the terminal of the package for the same signal becomes almost equal to an input capacitance in case where only a single bonding pad is provided on a semiconductor chip.

These objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

An embodiment of the present invention will be described in the following with reference to the drawings. Portions identical or corresponding to those in the above described conventional device will be omitted from the following description of the embodiment.

Figure 1:
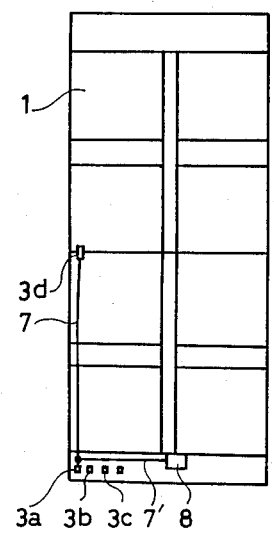
FIG. 1 is a view showing an example of a structure of a semiconductor device comprising a plurality of bonding pads for receiving and transmitting an identical signal.
Figure 2:
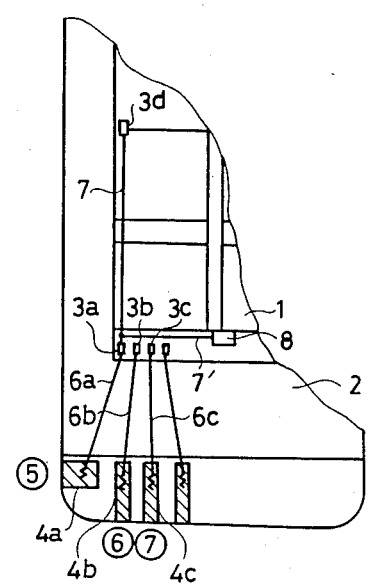
FIG. 2 is a partial plan view showing an example of a structure of the semiconductor device shown in FIG. 1 which is assembled in a ceramic package.
Figure 3:
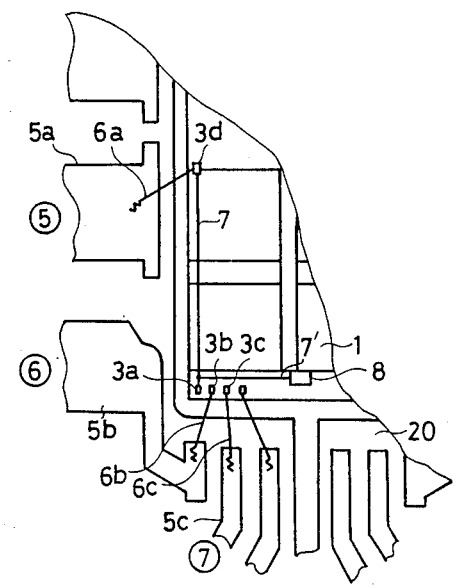
FIG. 3 is a partial plan view showing an example of a structure of the semiconductor device shown in FIG. 1 which is assembled in a plastic mold package.
Figure 4:
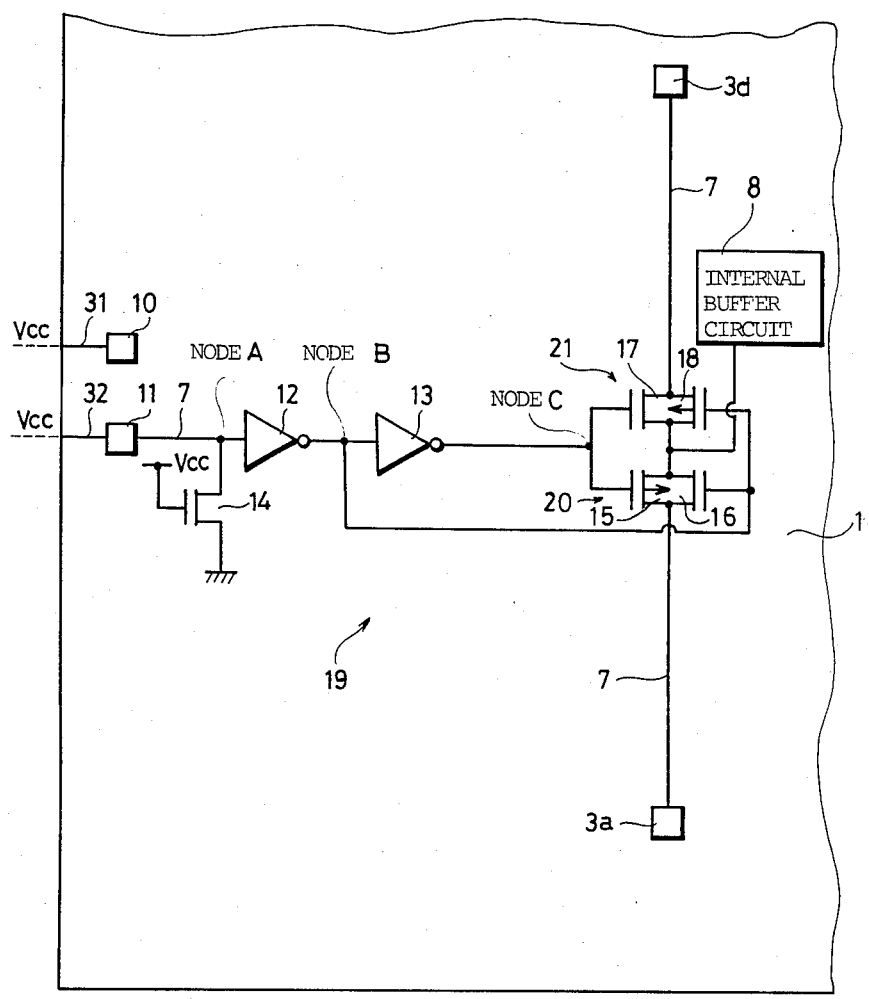
FIG. 4 is a diagram showing an example of a configuration of a semiconductor device in accordance with the present invention.

FIG. 4 is a partial diagram showing a semiconductor device according to an embodiment of the present invention. First, a structure of this device will be described. Referring to FIG. 4, this device comprises, on a semiconductor chip 1, a first bonding pad 3a for receiving a signal A0, a second bonding pad 3d for receiving the signal A0, a bonding pad 10 for receiving power supply voltage, a switch selection bonding pad 11 for receiving a control signal for selecting either the bonding pad 3a or the bonding pad 3d, and an internal buffer circuit 8 for being selectively connected through a switch circuit 19 to either the bonding pad 3a or the bonding pad 3d in response to the control signal supplied to the bonding pad 11. The bonding pad 10 for the power supply is bonded to a power supply terminal (not shown) of voltage $V_{cc}$ provided on a package (not shown) when the semiconductor device is assembled in the package. The switch selection bonding pad 11 is disposed near the bonding pad 10 for the power supply. The switch circuit 19 of this embodiment comprises: a first inverter 12 for inverting the signal received through the bonding pad 11 to provide an inverted output; a second inverter 13 for inverting the output of the first inverter 12, to provide an inverted output; a first bilateral switch 20 having an input connected to the first bonding pad 3a and turning on and off in response to the outputs of the first and second inverters 12 and 13, thereby to connect the first bonding pad 3a to the internal buffer circuit 8; a second bilateral switch 21 having an input connected to the second bonding pad 3d for the signal A0 and turning on and off in response to the outputs of the first and second inverters 12 and 13, thereby to selectively connect the second bonding pad 3d to the internal buffer circuit 8; and an MOS transistor 14 provided in an input portion of the first inverter 12 for controlling potential of the input portion of the first inverter 12 according to potential of the bonding pad 11.

The MOS transistor 14 has a drain connected to the input portion (a node A) of the first inverter 12, a gate connected to the power supply potential $V_{cc}$ and a source connected to the ground potential.

The first bilateral switch 20 comprises a p channel MOS transistor 15 and an n channel MOS transistor 16. The drain of the p channel MOS transistor 15 and the drain of the n channel MOS transistor 16 are connected with each other and the respective sources thereof are also connected with each other. The respective drains of the MOS transistors 15 an 16 are connected to the first bonding pad 3a for the signal A0. The gate of the p channel MOS transistor 15 is connected to the output of the second inverter 13. The gate of the n channel MOS transistor 16 is connected to the output of the first inverter 12.

The second bilateral switch 21 comprises an n channel MOS transistor 17 and a p channel MOS transistor 18. The drain of the n channel MOS transistor 17 and the drain of the p channel MOS transistor 18 are connected with each other and those drains are connected to the second bonding pad 3d for the signal A0. The respective sources of the p channel MOS transistor 18 and the n channel MOS transistor 17 are connected with each other. The gate of the n channel MOS transistor 17 receives an output from the second inverter 13. The gate of the p channel MOS transistor 18 receives an output from the first inverter 12.

A node between the first and second bilateral switches 20 and 21 are connected to the internal buffer circuit 8. The bonding pad 11 and the first inverter 12 are connected through a wire 7.

Now, operation of the semiconductor device of this embodiment will be described. First, let us consider a case in which a power supply terminal of a package is not bonded to the switch selection bonding pad 11. In this case, the bonding pad 11 is in a floating state. Consequently, the node A attains the ground potential, namely, a level L because the n channel MOS transistor 14 is always conducted. Accordingly, the output potential of the first inverter 12 (the potential of the node B) is at a level H and the output potential of the second inverter 13 (the potential of the node C) is at the level L. As a result, the p channel MOS transistor 15 and the n channel MOS transistor 16 are conducted, whereby the first lateral switch 20 is turned on. On the other hand, the n channel MOS transistor 17 and the p channel MOS transistor 18 are both cut off, whereby the second bilateral switch 21 is turned off. Thus, the first bonding pad 3a for the signal A0 is connected to the internal buffer circuit 8 through the first bilateral switch 20. On the other hand, the second bonding pad 3d for the signal A0 is disconnected from the internal buffer circuit 8.

Next, let us consider another case in which the power supply terminal of the package is bonded to the power supply bonding pad 10 by means of a bonding wire 31 and is at the same time bonded to the switch selection bonding pad 11 by means of a bonding wire 32. In this case, the node A is always made to attain the level H since the power supply voltage $V_{cc}$ is applied to the bonding pad 11. Accordingly, the node B is at the level L and the node C is at the level H. As a result, the p channel MOS transistor 15 and the n channel MOS transistor 16 are both brought into a cut-off state, and the first bilateral switch 20 is turned off. On the other hand, the n channel MOS transistor 17 and the p channel MOS transistor 18 are conducted, so that the second bilateral switch 21 is turned on. Thus, the first bonding pad 3a for the signal A0 is disconnected from the internal buffer circuit 8 and the second bonding pad 3d for the signal A0 is connected to the internal buffer circuit 8 through the second bilateral switch 21.

Thus, dependent on whether the power supply terminal of the package is bonded to the switch selection bonding pad 11 or not, either one of the first and second bonding pads 3a and 3d for the signal A0 is connected to the internal buffer circuit 8 and the other bonding pad is disconnected from the internal buffer circuit 8. Therefore, although two bonding pads are provided on the semiconductor chip 1 for the purpose of receiving the same external signal, the input capacitance viewed from the external signal input pin can be made almost equal to an input capacitance in case in which only one bonding pad is provided on a semiconductor chip for the purpose of receiving an external signal.

Although the portion coming after the node C in the switch circuit 19 is formed by the MOS transistors of both the n channel and p channel types in the above described embodiment, this portion may be formed by MOS transistors of either the n channel type or the p channel type having the same function as described above. In such a case, the same effect can be obtained.

Although the switch selection bonding pad 11 is provided near the power supply bonding pad 10 in the above described embodiment so that the node A is at the ground level when the power supply terminal of the package is not bonded to the switch selection bonding pad 11, the switch selection bonding pad 11 may be disposed near a grounding bonding pad (not shown) on the semiconductor chip 1 and a p channel MOS transistor may be used in place of the n channel MOS transistor 14. In this case, connection may be established in the following manner. The drain of this p channel MOS transistor is connected to a power supply line of the power supply voltage $V_{cc}$ and the gate thereof is grounded so that the node A attains the power supply voltage when a ground terminal (not shown) on the package is not bonded to the switch selection bonding pad 11. On the other hand, the node B is connected to the respective gates of the p channel MOS transistor 15 and the n channel MOS transistor 17, and the node C is connected to the respective gates of the n channel MOS transistor 16 and the p channel MOS transistor 18. Thus, the same effect as in the above described embodiment can be obtained.

In addition, although two bonding pads are provided on the semiconductor chip in the above described embodiment for the purpose of receiving the same external signal, the present invention is applicable to a case in which three or more bonding pads are provided on a semiconductor chip for the purpose of receiving the same external signal.

Further, although the plurality of bonding pads are used as the bonding pads for receiving the external signals, those bonding pads may serve as output bonding pads for transmitting signals from the semiconductor chip.

As described above, according to the present invention, only one bonding pad out of the plurality of bonding pads for receiving transmitting the same signal, connected to the same internal circuit is selectively connected to the internal circuit according to a control signal supplied from an external equipment. Consequently, although the plurality of bonding pads for receiving and transmitting the same signal are provided on the semiconductor chip, the input capacitance viewed from the corresponding external signal input pin can be made almost equal to an input capacitance in case where only a single bonding pad for an external signal is provided on a semiconductor chip.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a semiconductor device comprising a plurality of first bonding pads provided on a semiconductor chip for transmitting and receiving an identical signal to and from an external apparatus, and an internal buffer circuit for transmitting and receiving said signal to and from said plurality of first bonding pads, said plurality of first bonding pads and said internal circuit being formed on the same semiconductor chip, circuitry for reducing capacitance at said first bonding pads as viewed from said external apparatus, comprising:

a second bonding pad provided on said semiconductor chip for receiving an external control signal, and selection circuitry provided between said plurality of first bonding pads and said internal buffer circuit for connecting only a selected one of said plurality of first bonding pads to said internal buffer circuit in response to said control signal supplied through said second bonding pad so that capacitance at the unselected bonding pad is isolated from the selected bonding pad.

2. A semiconductor device in accordance with claim 1, wherein
said selection means comprises:
a first inverter (12) for inverting said control signal received through said second bonding pad and providing an output,
a second inverter (13) for inverting said output of said first inverter and providing an output,
a first bilateral switch (20) having an input connected to one of said first bonding pads and turning on and off in response to the outputs of said first and second inverters, said first bilateral switch being formed by a p channel MOS transistor (15) and an n channel MOS transistor (16) for selectively passing the output of said one of said first bonding pads, and
a second bilateral switch (21) having an input connected to another bonding pad out of said first bonding pads and turning on and off in response to the outputs of said first and second inverters, said second bilateral switch being formed by a p channel MOS transistor (18) and an n channel MOS transistor (17) for selectively passing an output of said another bonding pad,
said first and second bilateral switches being in a relation in which either one of said first and second bilateral switches is turned on while the other one of said switches is turned off, and the outputs of said first and second bilateral switches being commonly connected to said internal circuit.

3. In a semiconductor device formed on a semiconductor chip to be located within a package, said device including an internal buffer circuit and a plurality of bonding pads for transmitting signals between the internal buffer circuit and an external apparatus, first and second ones of said bonding pads to be connected to a common external signal source or load, the improvement for reducing capcitance at each of said first and second bonding pads, comprising:
selecting means for selecting between first and second signal paths connecting said internal buffer circuit and the common external signal source or load,
said selecting means including
controllable switching means for switchably selecting between said first and second bonding pads of said semiconductor device, depending upon the types of package within which said device is located, and for providing a connection path between the selected bonding pad and said internal buffer circuit; and
a control bonding pad for receiving an external control signal;
said switching means responsive to said control signal at said control bonding pad for switching into connection with said internal circuit a selected one of said first and second bonding pads and an associated connection path;
whereby capacitances at said first and second bonding pads, viewed by said common external signal source or load, are isolated from each.

4. An improved semiconductor device as recited in claim 3, wherein said controllable switching means comprises first bilateral switching means connected between said internal circuit and a first bonding pad and connecting path, and second bilateral switching means connected between said internal circuit and a second bonding pad and connecting path,
said first and second bilateral switching means each responsive to said control signal on said control bonding pad means.

5. An improved semiconductor device as recited in claim 4, wherein said first and second bilateral switching means each comprises a p channel MOS transistor and an n channel MOS transistor for respectively providing said connection path bilaterally between said internal circuit and said first and second bonding pads.

6. In a semiconductor device formed on a semiconductor chip including an internal circuit and a plurality of bonding pads for transmitting signals between the internal circuit and an external apparatus, the improvement comprising:
selecting means for selecting between first and second signal paths connecting said internal circuit and the external apparatus,
said selecting means including
controllable switching means for switchably selecting between first and second bonding pads of said semiconductor device and for providing a connection path between the selected bonding pad and said internal circuit; and
control bonding pad means for receiving a control signal from an external device;
said switching means responsive to said control signal of said control bonding pad for switching into connection with said internal circuit a selected one of said first and second bonding pads and an associated connection path;
wherein said controllable switching means comprises a first bilateral switching means connected between said internal circuit and a first bonding pad and connecting path, and a second bilateral switching means connected between said internal circuit and a second bonding pad and connecting path;
said first and second bilateral switching means each responsive to said control signal on said control bonding pad means;
wherein said first and second bilateral switching means each comprises a p channel MOS transistor and an n channel MOS transistor for respectively providing said connection path bilaterally between said internal circuit and said first and second bonding pads;
further comprising inverting means for providing respectively inverted forms of said control signal to said first and second bilateral switching means, whereby one of said bilateral switching means and connecting path is selected responsively to a first polarity of said control signal and the other of said bilateral switching means and connecting path is selected responsively to an opposite polarity of said control signal.

7. An improved semiconductor device as recited in claim 6 wherein said inverting means comprises:
first means for providing said control signal to said p channel MOS transistor of said first bilateral switching means and to said n channel MOS transistor of said second bilateral switching means, and
second means for providing an inverted form of said control signal to said n channel MOS transistor of said first bilateral switching means and to said p channel MOS transistor of said second bilateral switching means.

8. An improved semiconductor device as recited in claim 7 wherein said internal circuit comprises an internal buffer circuit.

9. An improved semiconductor device as recited in claim further comprising inverting means for providing respectively inverted forms of said control signal to said first and second bilateral switching means, whereby one of said bilateral switching means and connecting path is selected responsively to a first polarity of said control signal and the other of said bilateral switching means and connecting path is selected responsively to an opposite polarity of said control signal.

10. An improved semiconductor device as recited in claim 3 wherein said semiconductor chip is mounted in a package and said control signal is provided to said control bonding pad as a function of a configuration of said package.

11. An improved semiconductor device as recited in claim 10 wherein said internal circuit comprises an internal buffer circuit.

12. An improved semiconductor device as recited in claim 3 wherein said internal circuit comprises an internal buffer circuit.

13. A semiconductor device comprising a plurality of first bonding pads provided on a semiconductor chip for transmitting and receiving an identical signal to and from an external apparatus, and an internal buffer circuit for transmitting and receiving said signal to and from said plurality of first bonding pads, said plurality of first bonding pads and said internal circuit being formed on the same semiconductor chip, said semicondictor device further comprising:

a second bonding pad provided on said semiconductor chip for receiving a control control signal supplied from an external external apparatus outside said semiconductor chip, selection means provided between said plurality of first bonding pads and said internal circuit for selectively connecting only one of said plurality of first bonding pads to said buffer circuit in response to said control signal supplied through said second bonding pad, said selection means comprises:

a first inverter for inverting said control signal received through said second bonding pad and providing an output, a second inverter for inverting said output of said first inverter and providing an output, a first bilateral switch having an input connected to one of said first bonding pads and turning on and off in response to the outputs of said first and second inverters, said first bilateral switch being formed by a p channel MOS transistor and an n channel MOS transistor for selectively passing the output of said one of said first bonding pads, and a second bilateral switch having an input connected to another bonding pad out of said first bonding pads and turning on and off in response to the outputs of said first and second inverters, said second bilateral switch being formed by a p channel MOS transistor and an n channel MOS transistor for selectively passing an output of said another bonding pad, said first and second bilateral switches being in a relation in which either one of said first and second bilateral switches is turned on while the other one of said switches is turned off, and the outputs of said first and second bilateral switches being commonly connected to said internal circuit.

* * * * *